United States Patent [19]
Inoue et al.

[11] Patent Number: 5,278,792
[45] Date of Patent: Jan. 11, 1994

[54] SEMICONDUCTOR MEMORY DEVICE WITH DUMMY CYCLE OPERATION

[75] Inventors: Kazunari Inoue; Yuko Ozeki, both of Hyogo, Japan

[73] Assignee: Mitsubishi Denki Kabushiki Kaisha, Tokyo, Japan

[21] Appl. No.: 824,623

[22] Filed: Jan. 23, 1992

[30] Foreign Application Priority Data

Jan. 28, 1991 [JP] Japan .................................. 3-8653

[51] Int. Cl.$^5$ .............................................. G11C 7/00
[52] U.S. Cl. .................................. 365/193; 365/194; 365/226; 365/233
[58] Field of Search ............... 365/191, 193, 194, 226, 365/189.08, 189.09, 233, 210

[56] References Cited

U.S. PATENT DOCUMENTS 4,933,902  6/1990  Yamada et al. ................ 365/189.08

FOREIGN PATENT DOCUMENTS 60-113392  6/1985  Japan .
60-242587  12/1985  Japan .

OTHER PUBLICATIONS

Intel Corp., 8-Bit Embedded Controller Handbook, 1990, pp. 1-10.

*Primary Examiner*—Joseph A. Popek
*Attorney, Agent, or Firm*—Lowe, Price, LeBlanc & Becker

[57] ABSTRACT

A semiconductor memory device capable of internally generating a dummy cycle includes circuits for generating dummy cycle designation signals in response to at least one of predetermined external control signdlsircuits for generating a dummy cycle signal predetermined times in response to the output signal of such circuits. The dummy cycle signal drives a desired internal circuit. The internal and automatic generation of a dummy cycle signal allows a circuit in addition to an RAS related circuit to execute a dummy cycle. As a result, a semiconductor memory device having multifunction is allowed to reliably initialize a desired internal circuit without designing complicated timing and providing additional pin terminals.

20 Claims, 12 Drawing Sheets

SEMICONDUCTOR MEMORY DEVICE WITH DUMMY CYCLE OPERATION

DETAILED DESCRIPTION OF THE INVENTION

1. Field of the Invention

The present invention relates generally to semiconductor memory devices, and more particularly, to a circuit structure for executing a dummy cycle for initializing (resetting) an internal circuit, which cycle is first performed after turning-on of a power source or after changing an operation mode.

2. Description of the Related Art

FIG. 1 is a block diagram showing the entire structure of a conventional dynamic random access memory (hereinafter referred to as a DRAM). In FIG. 1, DRAM 100 includes a memory cell array 1 including a plurality of dynamic type memory cells MCs arranged in a matrix of rows and columns, a row decoder 8 for selecting one row of memory cells in memory cell array 1 based on an internal row address 3a from an address buffer 10, and a column decoder 9 for selecting a column or columns in memory cell array 1 based on an internal column address 3b from address buffer 10. Where DRAM 100 inputs/outputs data on a bit basis, column decoder 9 selects one of the columns in memory cell array 1. For DRAM 100 which inputs/outputs data on a basis of plurality of bits, for example, on a 4-bit basis, column decoder 9 selects a plurality of columns in memory cell array 1.

Address buffer 10 receives an external address A0-An applied to an address input terminal 2 to generate an internal address 3.

DRAM 100 includes a clock generator 11 for generating various internal control signals in response to control signals $\overline{RAS}$, $\overline{CAS}$ and $\overline{WE}$ applied to a clock input terminal 7, an input buffer 12 for receiving external write data Din applied to a data input terminal 4 to generate internal write data 6a, and an output buffer 13 for receiving a signal 6b on an internal data bus 6 to generate external read data Dout to apply the same to a data output terminal 5.

Control signal $\overline{RAS}$ is a row address strobe signal for designating a memory cycle of DRAM 100 and providing a timing for accepting a row address at address buffer 10. Control signal $\overline{CAS}$ is a column address strobe signal for providing a timing for accepting a column address at address buffer 10. Control signal $\overline{WE}$ is a signal for designating data write/read mode of DRAM 100.

An operation will be briefly described in the following.

When control signal $\overline{RAS}$ applied at clock input terminal 7 falls to active "L" (logical low), DRAM 100 enters a memory cycle. At this time, each column of memory cell array 1 is set in a floating state at a predetermined precharge potential.

Address buffer 10 accepts external address A0-An at address input terminal 2 as a row address in response to the fall of the control signal $\overline{RAS}$ and generates internal row address 3a to apply the same to row decoder 8. Row decoder 8 similarly operates in response to the control signal $\overline{RAS}$ to decode the internal row address 3a, thereby selecting one row of memory cell array 1.

When the potential of the selected row rises to "H" (logical high) in response to a row selection signal from row decoder 8, data of the memory cells MC at this row are transmitted onto the corresponding columns. Memory cell data transmitted onto each column is amplified by a sense amplifier (not shown) provided corresponding to each column. Activation of the sense amplifier is executed after a lapse of a predetermined time period after fall of the external control signal $\overline{RAS}$.

Then, control signal $\overline{CAS}$ at clock input terminal 7 enters an active state of "L". In response to an internal clock signal generated from clock generator 11 in response to the fall of the control signal $\overline{CAS}$, address buffer 10 accepts external address A0-An at address input terminal 2 as a column address and generates internal column address 3b to apply the same to column decoder 9. Column decoder 9 is activated in response to an internal control signal generated from clock generator 11 in response to the fall of the external control signal $\overline{CAS}$, decodes the internal column address and generates a signal for selecting a corresponding column in memory cell array 1. As a result, the selected column is connected to internal data bus 6.

External control signal $\overline{WE}$ attains "L" in data writing. Input buffer 12 is activated in response to an internal control signal generated from clock generator 11 when both of the external control signal $\overline{CAS}$ and the external control signal $\overline{WE}$ attain "L" thereby generating internal write data 6a from external write data Din received through data input terminal 4 to transmit the generated data to internal common data bus 6. The internal write data transmitted onto the internal common data bus 6 is written in a memory cell MC located at an intersection of the selected row and column through the selected column. Timing for writing data, that is, timing for input buffer 12 to generate internal write data 6a, corresponds to a later one of the falls of internal control signals $\overline{CAS}$ and $\overline{WE}$.

External control signal $\overline{WE}$ is at "H" in data reading. At this time, output buffer 13 is activated in response to an internal control signal generated from clock generator 11 in response to a fall of external control signal $\overline{CAS}$, thereby generating external read data Dout from internal signal 6b on internal data bus 6, which read data is applied to external output terminal 5.

The foregoing is a common operation of a conventional DRAM. DRAM 100 includes a circuit driven in response to external control signal $\overline{RAS}$ and a circuit driven in response to external control signal $\overline{CAS}$ as described above. The circuit driven in response to external control signal $\overline{RAS}$ is referred to as RAS related circuitry and the circuit driven in response to external control signal $\overline{CAS}$ as CAS related circuitry hereinafter.

Not only memory cell array 1 but also a peripheral circuit dynamically operate in a DRAM. Each signal line is precharged to a predetermined precharge potential and then set to a floating state in the dynamic operation. An operation called "dummy cycle" is performed for initializing a circuit (hereinafter referred to as a dynamic circuit) performing such dynamic operation.

FIG. 2 is a signal waveform diagram showing an operation in a dummy cycle immediately after turning-on of a power source. In FIG. 2, external control signal $\overline{RAS}$ is toggled predetermined times (eight times in general) after supplying a power source voltage VDD to a DRAM. At this time, external control signal $\overline{CAS}$ is maintained at "H" of an inactive state. Toggling of the external control signal $\overline{RAS}$ is followed by the drive of RAS related circuitry in accordance with each active state of control signal $\overline{RAS}$. For example, the following operation will be performed in memory cell array 1. A word line (an arbitrary address) is selected to read memory cell data onto each a column (bit line), which is followed by sensing/amplification of data on each column by a sense amplifier. Subsequently, the memory cell data sensed and amplified by the sense amplifier is restored followed by rendering the word line non-selected and the sense amplifier inactive. Then, each column is precharged to the predetermined precharge potential in response to the inactive state of the control signal $\overline{RAS}$.

Repetition of this operation predetermined times results in reliably precharging each bit line in memory cell array 1 to a predetermined potential. In general, each column of a DRAM includes a pair of bit lines potentials of which are equalized in a precharge cycle. Similarly, a signal line in the RAS related circuitry is precharged to a predetermined potential.

Execution of such a dummy cycle after an initial application of a power source voltage enables initialization of a DRAM and subsequent data writing to be reliably performed.

The DRAM shown in FIG. 1 is not allowed to carry out data write and data read at the same time. With such a DRAM used as a frame buffer in an image processing system, access to the DRAM by a CPU (Central Processing Unit) is not possible during data transfer from the DRAM to an image display apparatus. Access to the DRAM by the CPU is possible only in a short time period such as a horizontal blanking period. This reduces a processing speed of the image process system. Thus, many of image processing systems employ, as a frame buffer, a storage device called a dual port random access memory (or video random access memory: hereinafter referred to as VRAM) allowing data transfer to an image display apparatus and access by a CPU to be simultaneously performed.

FIG. 3 is a block diagram showing the entire structure of a conventional VRAM. In FIG. 3, a VRAM 200 includes an RAM port including a DRAM memory cell array 1, a row decoder 8, a column decoder 9, an address buffer 10 and an RAM input/output circuit 55. The structure of this RAM port is the same as that of the DRAM shown in FIG. 1, with the same reference numerals allotted to the corresponding portions. RAM input/output circuit 55 includes input buffer 12 and output buffer 13 shown in FIG. 1. RAM input/output circuit 55 sends and receives data to/from the outside of the device through an RAM data input/output terminal 50 on a plural of bit basis. An internal data bus 60 therefore includes a plurality of signal lines.

VRAM 200 further includes a serial register 14 capable of storing data of one row of DRAM memory cell array 1, a transfer circuit 15 for transferring data between serial register 14 and a selected row of DRAM memory cell array 1, a serial selector 16 for sequentially connecting the register circuits included in serial register 14 to a SAM internal data bus 21, and a SC buffer 19 for generating an internal clock signal determining selecting operation timing and selecting operation speed of serial selector 16.

SC buffer 19 generates an internal clock signal in response to an external clock signal SC received through clock input terminal 17. Serial selector 16 accepts an internal column address 3b from address buffer 10 in response to an internal clock generated from a clock generator 110 in response to a fall of an external control signal $\overline{CAS}$ and outputs the address as a selection starting address of serial register 14. Serial selector 16 sequentially increments the address, starting with the start address, in response to the internal clock signal from SC buffer 19.

Clock generator 110 generates various internal clock signals in response to the external clock signals DSF, $\overline{RAS}$, $\overline{CAS}$, $\overline{DT/OE}$ and $\overline{WB/WE}$ received through a clock input terminal 70. Such circuits related to data writing/reading through a SAM data input/output terminal 18 as serial register 14, serial selector 16, SC buffer 19 and a SAM input/output circuit 20 are referred to as SAM ports.

Control signal $\overline{DT/OE}$ designates a data output operation and also indicates whether data transfer is to be performed between the RAM port and the SAM port. Control signal $\overline{WB/WE}$ designates a write per bit operation as well as a data writing operation in the RAM port. The write per bit operation is an operation mode in which data transfer is carried out between the SAM port and the RAM port with masking on a bit (one bit at SAM data input/output terminal 18) basis. Control signal DSF is a control signal for determining whether the VRAM is to enter a special operation mode or not. This special operation mode will be described later.

A control signal $\overline{SE}$ is applied to SAM input/output circuit 20 which in turn outputs a control signal QSF. The control signal $\overline{SE}$ is a control signal for setting a serial port (SAM port) to an enable state. When the control signal $\overline{SE}$ is inactive, the SAM port performs no operation and SC buffer 19 generates no internal clock signal.

Control signal QSF is a signal for indicating that a serial register of which block is used where serial register 14 is divided into blocks. That is, serial register 14 is divided into blocks such that data transfer is being carried out between one of the blocks and SAM input/output circuit 20, while data transfer is performed between the remaining register blocks and DRAM memory cell array 1. Alternate repetition of the operations results in successive data writing/reading to and from the SAM port without interruption. At this time, an external device requires monitoring a block from which data is being read and the control signal QSF is used for this purpose. One of the block arrangements of serial register 14 is that one block corresponds to a half row of DRAM memory cell array 1 and the other is that one block corresponds to one row of DRAM memory cell array 1.

Description will be given to an operation in the following. Data input/output to/from the RAM port is similar to that in the DRAM shown in FIG. 1 and row selection, column selection and data input/output are carried out in response to control signals $\overline{RAS}$, $\overline{CAS}$, $\overline{DT/OE}$ and $\overline{WB/WE}$. In driving the SAM port, control signal SE is activated. Serial selector 16 latches internal column address 3b generated from address buffer 10 in response to an internal clock generated from clock generator 110 in response to a fall of control signal $\overline{CAS}$. The latched internal column address is used as a start address indicative of a location of a register selected first in serial register 14. SC buffer 19 generates an internal clock in response to an external clock signal SC and applies the same to serial selector 16. Serial selector 16 shifts a position of a register to be selected in serial register 14 one by one in response to the internal clock signal from SC buffer 19. Serial register 14 connects a register selected by serial selector 16 with SAM internal data bus 21. Whether the SAM port is in a data writing mode or a data reading mode is determined by whether the cycle wherein previous data transfer is carried out is a read transfer cycle or a write transfer cycle.

If the previous cycle is a read transfer cycle wherein data is transferred from DRAM memory cell array 1 to serial register 14 through a transfer circuit 15, the SAM port enters a data reading mode. If data is transferred from serial register 14 to DRAM memory cell array 1 through transfer circuit 15, the SAM port enters a data writing mode. The data transfer operation will be described in the following.

FIG. 4 specifically shows the structure of a portion related to the data transfer of the VRAM shown in FIG. 3. In FIG. 4, DRAM memory cell array 1 includes word lines WL disposed in a row direction and bit lines BL and $\overline{BL}$ disposed to cross the word lines WL. Word line WL determines a row of memory cell array 1 and a pair of bit lines BL and $\overline{BL}$ determines one column of DRAM memory cell array 1. A memory cell MC is arranged corresponding to a cross-over point of a pair of bit lines BL and $\overline{BL}$ and a word line WL. Memory cell MC includes a capacitor C for storing information and a transfer transistor TR including an MOS transistor, for example, for connecting the capacitor C to the corresponding bit line BL (or $\overline{BL}$) in response to a signal on the word line WL.

Transfer circuit 15 includes a transfer gate TG, provided for each bit line BL and $\overline{BL}$, to be turned on in response to a transfer instructing signal XF.

Serial register 14 includes a data register circuit 14a including data registers DR each provided corresponding to each pair of transfer gates TG and a selection circuit 14b including selection gates SG to be turned on in response to a selection signal from serial selector 16 to connect the corresponding data register DR to SAM internal data bus 21. Data register DR is structured by an inverter latch including two inverters, thereby constituting a static type memory cell. A data transfer operation will be described in the following.

Description will be given to a read transfer cycle wherein data is transferred from DRAM memory cell array 1 to serial register 14. The read transfer cycle is designated by setting control signals $\overline{CAS}$ and $\overline{WB/WE}$ to "H" at the falling edge of external control signal $\overline{RAS}$ and control signals $\overline{DT/OE}$ and DSF to "L". The states of control signal $\overline{SE}$ and clock signal SC are arbitrary at this time. In this state, a row selecting operation in the DRAM is carried out in accordance with external address A0–An applied to address input terminal 2 at the falling edge of control signal $\overline{RAS}$. That is, data of a memory cell MC connected to the selected row WL is transmitted to the corresponding bit line BL (or $\overline{BL}$). Subsequently, a sense amplifier (not shown) operates to establish the data of each bit line pair.

Subsequently, when control signal $\overline{CAS}$ falls, an external address A0–Am is accepted by address buffer 10 as an internal column address. Internal column address 3b from address buffer 10 is latched by serial selector 16 as a start address. Thereafter, when external control signal $\overline{DT/OE}$ is brought to "H", internal transfer instructing signal XF is responsively generated to turn on transfer gates TG. As a result, data on each bit line pair of BL and $\overline{BL}$ is transmitted to the corresponding data register DR. After the completion of this transfer operation, serial selector 16 shifts, starting with the start address, a position of a register to be selected one by one in response to an internal clock from external SC buffer 19, thereby turning on thus selected gate SG. The foregoing is the operation done in read transfer cycle for transferring data from the RAM port to the SAM port.

The write transfer cycle wherein data is transferred from the SAM port to the RAM port is designated by setting control signal $\overline{CAS}$ to "H" and control signals $\overline{DT/OE}$, $\overline{WB/WE}$ and DSF to "L" at the falling edge of external control signal $\overline{RAS}$. Similar to the above-described read transfer cycle, internal transfer instructing signal XF is generated at a rising edge of external control signal $\overline{DT/OE}$ after the completion of row selection in DRAM array 1 and sensing operation of memory cell data. As a result, the data stored in data registers DR are transmitted onto the corresponding columns and written in the respective memory cells MC.

In this write transfer cycle, data transfer from the SAM port to the RAM port is carried out in practice by setting control signal $\overline{SE}$ to "L" at a falling edge of control signal $\overline{RAS}$. Setting control signal SE to "H" generates no internal data transfer instructing signal XF, thereby preventing data transfer from the SAM port to the RAM port. This transfer cycle is referred to as a pseudo write transfer cycle, which is an operation mode for simply switching an output mode of SAM input/output circuit 20 to operate in an input mode.

In a conventional DRAM, RAS related circuitry is initialized by toggling only an external control signal $\overline{RAS}$ predetermined times after turning-on of a power source. In this case, since a dummy cycle is determined by an external control signal, timing for entering a dummy cycle and returning therefrom is made complicated in a memory system. In addition, since the dummy cycle is activated in response to only the control signal $\overline{RAS}$, only RAS related circuitry is initialized in the DRAM but not the other circuits.

In particular, a DRAM having multi-function with complicated internal circuit structure resultantly includes a large number of circuits not initialized after turning-on of a power source. Reliable initialization of the DRAM therefore can not be done by a conventional dummy cycle using only the control signal $\overline{RAS}$.

Such an internal synchronization type RAM adapted to power source is disclosed in, for example, Japanese Patent Laying-Open No. 60-242587 as a pseudo static RAM operable by using a pulse signal from an address transition detection circuit as a clock signal. In the prior art RAM, end/inhibition of the dummy cycle is determined by an external control signal. The dummy cycle is stopped by setting a normal signal level at a pin terminal to a level different from that in a normal operation. The prior art discloses a dummy cycle for an RAM to be executed once in response to a detection of turning-on of a power source but not disclose repetition of the dummy cycle predetermined times after the turning-on of a power source.

Japanese Patent Laying-Open No. 60-113392 discloses the execution of a write cycle after turning-on of a power source as a dummy cycle in which an output buffer is set to an output high impedance state. According to the prior art, an output high impedance state is maintained only when a read mode is activated after turning-on of a power source and the dummy cycle is generated in response to an external control signal.

VRAM has come to include various functions in addition to such a data transfer operation as described above. As shown in FIG. 5, a function mode of the VRAM is designated by a combination of the states of control signals $\overline{DSF}$, $\overline{DT/OE}$, $\overline{WB/WE}$ and $\overline{SE}$ at a falling edge of each of control signals $\overline{RAS}$ and $\overline{CAS}$. Such function modes include a flash mode for rewriting of data of a row of a DRAM cell array at one time, a block write mode for total rewriting of 4 bits in a row of DRAM cell array 1, a raster operation mode for execution of a desired operation function, and an operation mode for selective data transfer on a block basis in a split buffer system or in a dual buffer system with a serial register including a plurality of blocks.

With any of such function modes designated, a dummy cycle for initializing each circuit as described above is executed in a first or starting operation cycle. A conventional dummy cycle, however, is executed only under the control of an external control signal $\overline{RAS}$, which enables only the initialization of RAS related circuitry. It is therefore difficult to reliably initialize all the required internal circuits for each operation mode of a multi-functional VRAM. For such an operation mode designated when a control signal DSF is "H" at a falling edge of $\overline{CAS}$, in particular, a dummy cycle using only the control signal $\overline{RAS}$ apparently makes initialization of such operation mode difficult, because the internal circuit driven in such an operation mode includes a CAS related circuit.

Another problem is that a conventional dummy cycle generated by using the control signal $\overline{RAS}$ does not allow each data register of a serial register to be reset.

SUMMARY OF THE INVENTION

An object of the present invention is to provide a semiconductor memory device capable of executing a dummy cycle with ease without requiring complicated timing design.

Another object of the present invention is to provide a semiconductor memory device with a dummy cycle enabling a desired circuit to be initialized with ease.

A further object of the present invention is to provide a method of initializing a semiconductor memory device with reliability and ease.

The semiconductor memory device according to the present invention includes circuitry for generating a dummy cycle designating signal in response to at least one of externally applied signals and circuitry for generating a control signal for driving a desired internal circuit predetermined times in response to the dummy cycle designating signal.

In the semiconductor memory device according to the present invention, a control signal for automatically executing a dummy cycle is internally generated in response to the dummy cycle designating signal. The dummy cycle is executed predetermined times to be automatically terminated. It is therefore possible to initialize not only an RAS related circuit but also all of desired internal circuits with ease without requiring complicated timing design.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
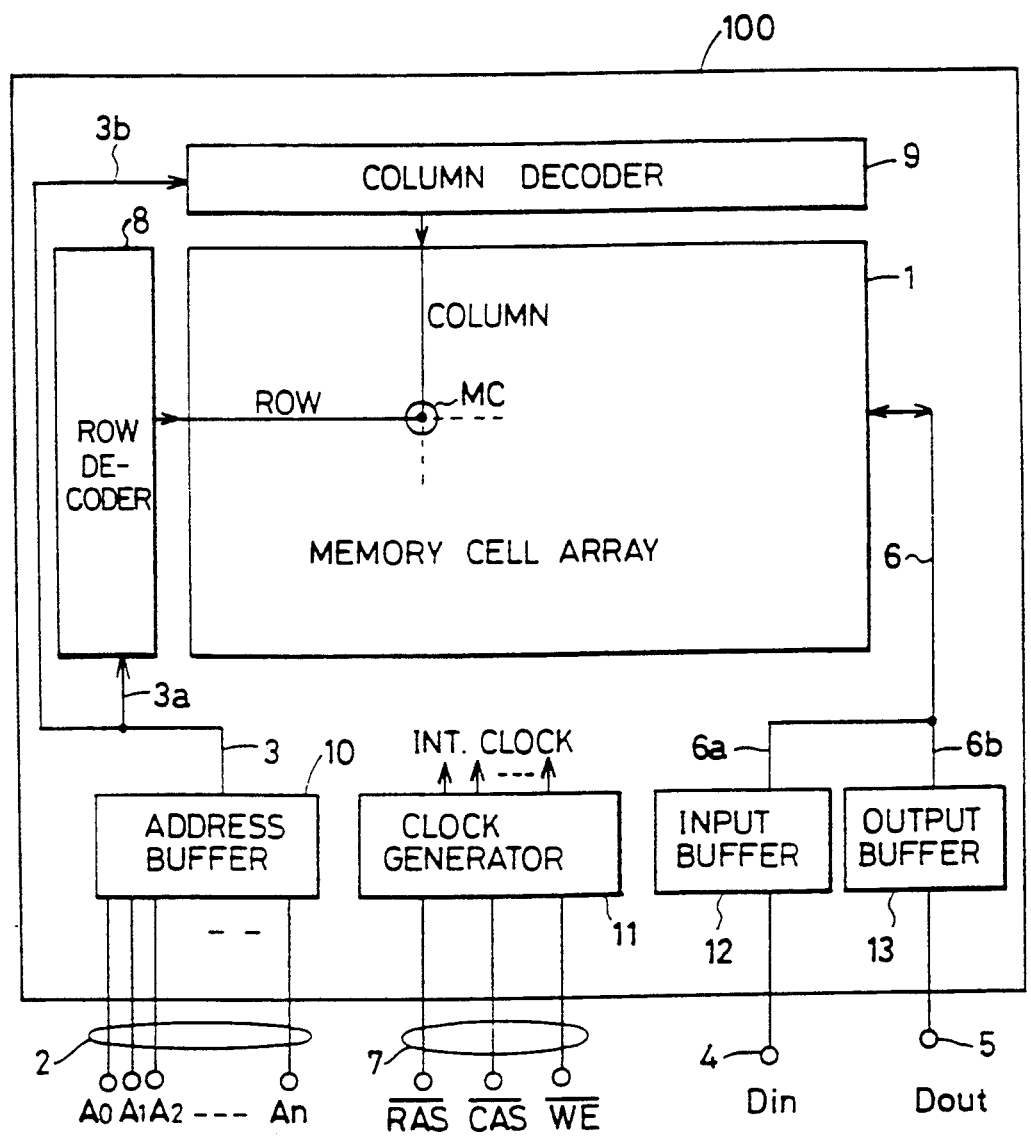
FIG. 1 is a schematic block diagram showing the entire structure of a conventional DRAM.
Figure 2:
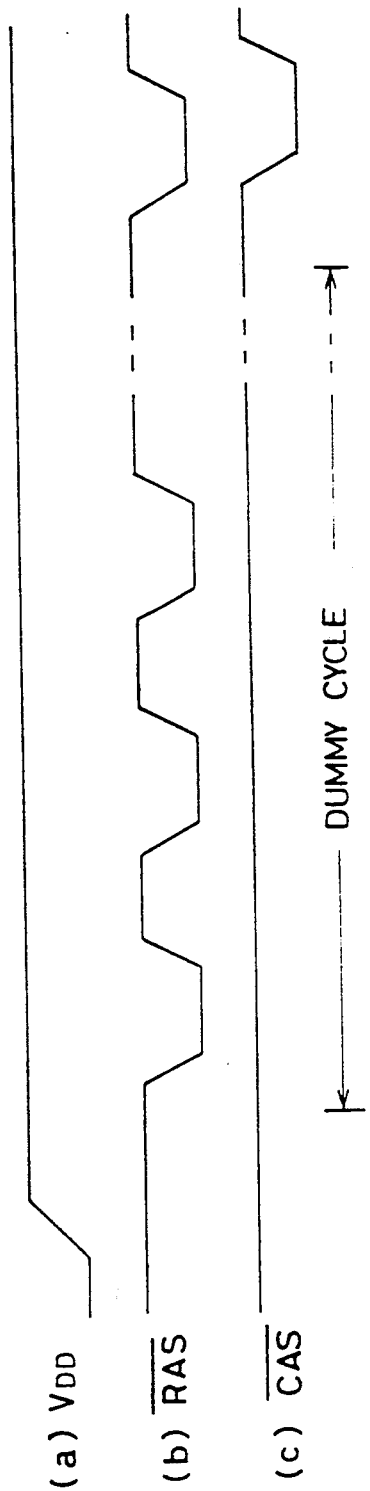
FIG. 2 is a signal waveform diagram showing the state of external control signals in the execution of a dummy cycle for the DRAM shown in FIG. 1.
Figure 3:
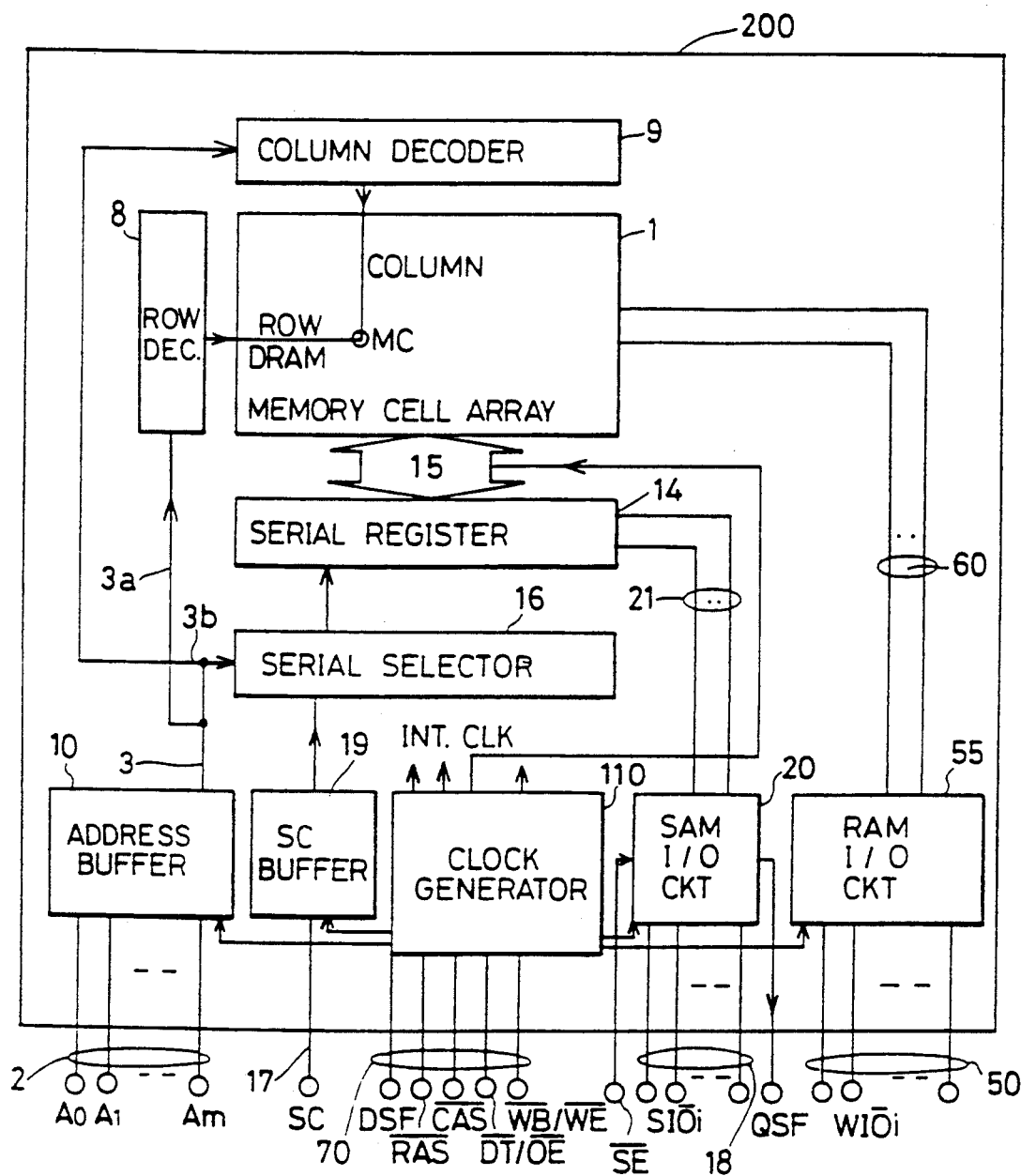
FIG. 3 is a block diagram showing the entire structure of a conventional VRAM.
Figure 6:
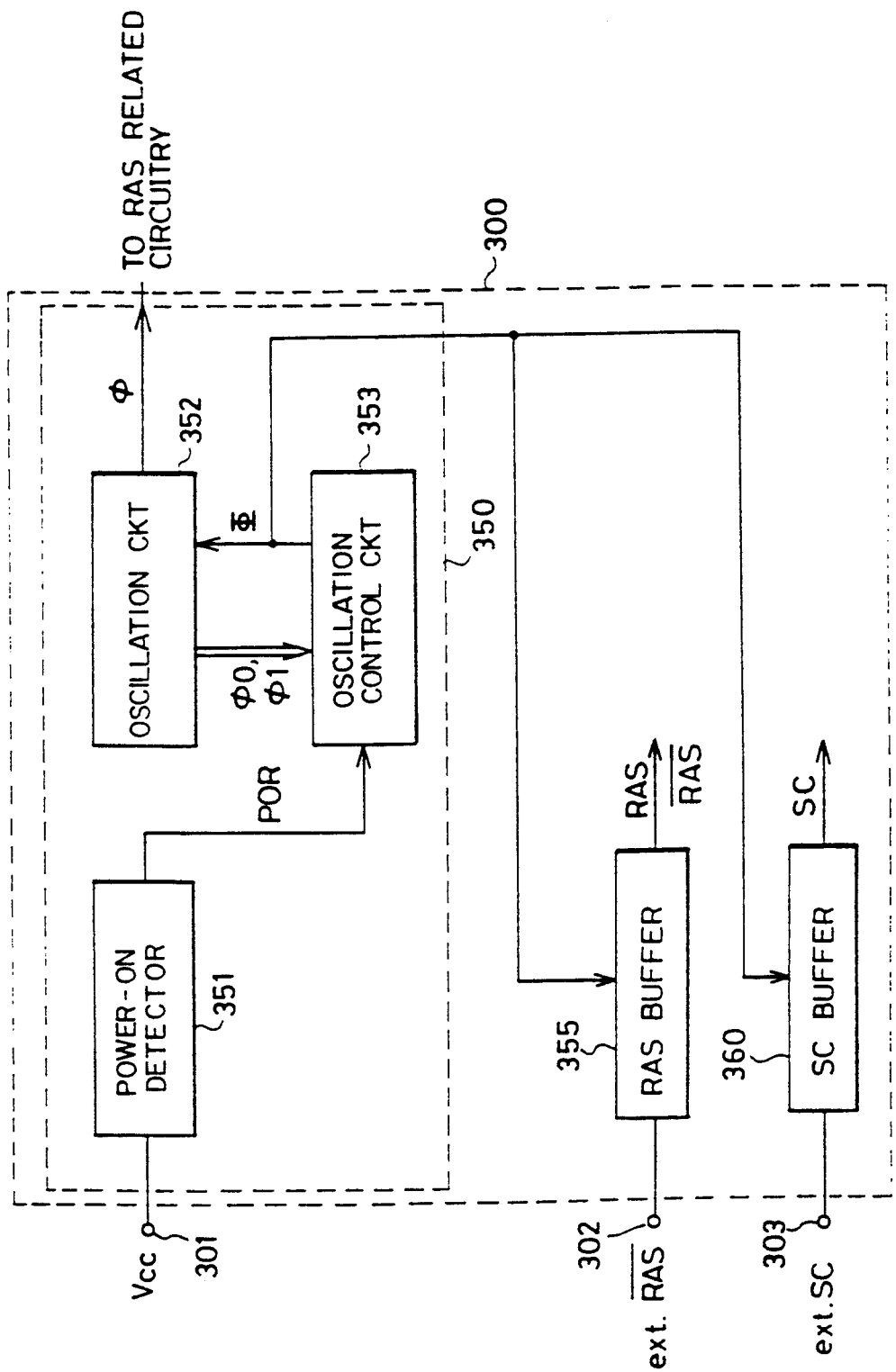
FIG. 6 is a functional block diagram showing the structure of a dummy cycle generation circuit according to one embodiment of the present invention.

FIG. 6 is a functional block diagram showing the structure of a dummy cycle generation circuit in a semiconductor memory device according to an embodiment of the present invention. A dummy cycle generation circuit 350 shown in FIG. 6 is included in a clock generator 300 for generating various internal clocks in response to external control signals. Where a semiconductor memory device is such a DRAM as shown in FIG. 1, the clock generator 300 corresponds to clock generator 11 shown in FIG. 1. Where the semiconductor memory device is such a VRAM as show in FIG. 3, the clock generator 300 corresponds to clock generator 110 and SC buffer 19 shown in FIG. 3. FIG. 6 shows a structure where the semiconductor memory device is VRAM as shown in FIG. 3. Dummy cycle generation circuit 350 shown in FIG. 6 provides a construction where a dummy cycle is internally and automatically generated at power-on as an example.

In FIG. 6, dummy cycle generation circuit 350 includes a power-on detection circuit 351 for detecting application of a power source voltage Vcc to a power source terminal 301 to generate a power-on detection signal POR having a predetermined pulse width, an oscillation control circuit 353 responsive to the power-on detecting signal POR for generating an oscillation control signal Φ for determining a dummy cycle and an oscillation circuit 352 responsive to the oscillation control signal Φ for generating a dummy cycle signal φ. The dummy cycle signal φ is applied to a desired internal circuit such as a RAS related circuit. FIG. 6 shows only an RAS related circuit as a desired internal circuit. The dummy cycle signal φ includes two-phase non-overlapping clock signals φ0 and φ1. Two-phase clock signals φ0 and φ1 from oscillation circuit 352 are applied to oscillation control circuit 353. The two-phase clock signals φ0 and φ1 determine duration of the active state of oscillation control signal Φ. That is, oscillation control signal Φ becomes inactive after two-phase clock signals φ0 and φ1 are generated predetermined times in response to the activation of oscillation control signal Φ.

Clock generator 300 further includes an RAS buffer 355 for receiving an external control signal ext.$\overline{RAS}$ applied to an external pin terminal 302 to generate internal control signals RAS and $\overline{RAS}$ and a SC buffer 360 for receiving an external clock signal ext.SC applied to an external pin terminal 303 to generate an internal clock signal SC. SC buffer 360 corresponds to SC buffer 19 shown in FIG. 3. The internal control signals RAS and $\overline{RAS}$ from RAS buffer 355 are applied to an RAS related circuit related to a row selecting operation. The internal clock signal SC from SC buffer 360 is applied to the serial selector 16 shown in FIG. 3.

RAS buffer 355 and SC buffer 360 have the outputs disabled when the oscillation control signal Φ is active. That is, external pin terminals 302 and 303 are deactivated during a dummy cycle in which the oscillation control signal Φ is generated in disregard of a change of the external control signal ext.$\overline{RAS}$ and/or ext.SC.

Figure 7:
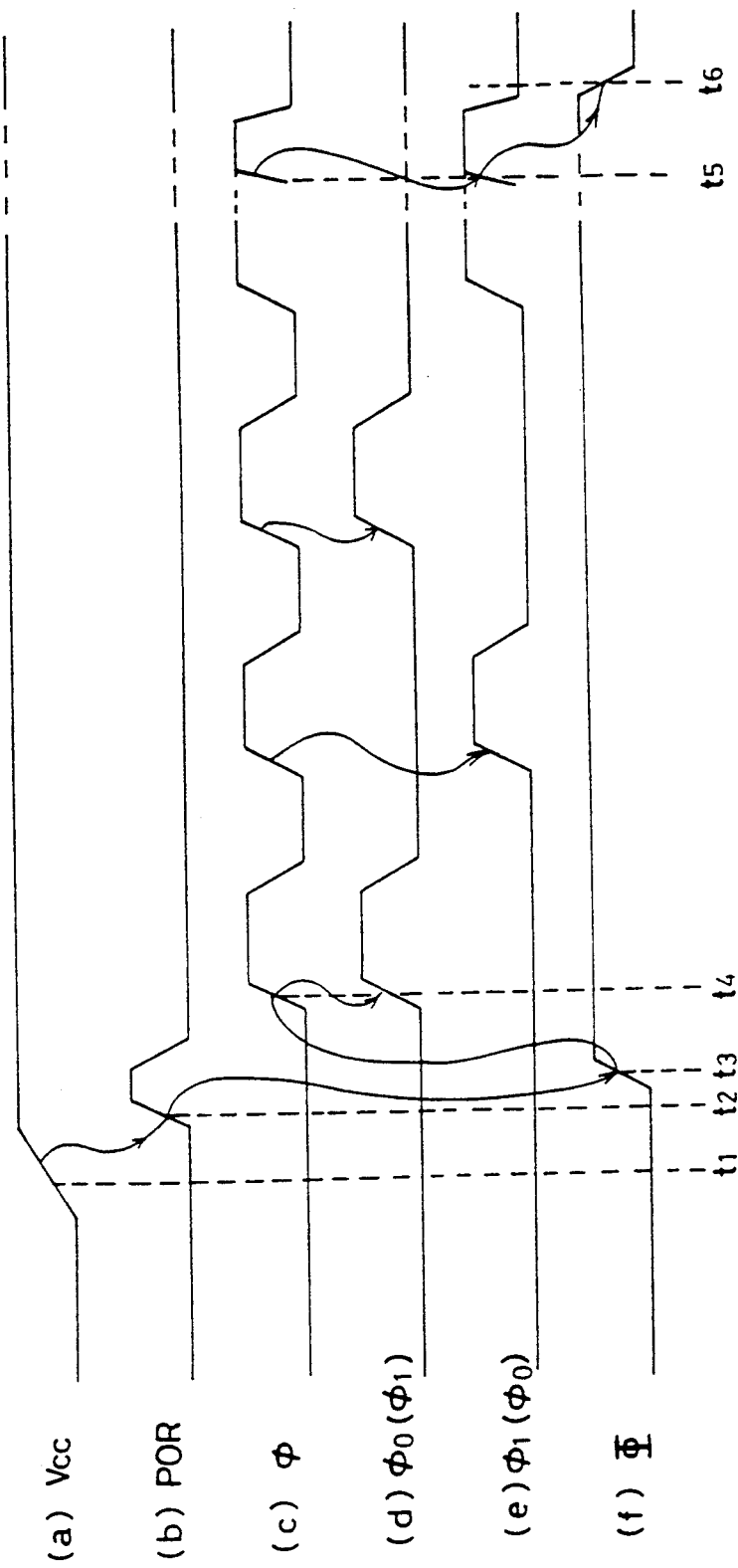
FIG. 7 is a signal waveform diagram showing the operation of the dummy cycle generation circuit shown in FIG. 6.

FIG. 7 is a signal waveform diagram showing the operation of dummy cycle generation circuit 350 shown in FIG. 6. The operation of dummy cycle generation circuit 350 will be described with reference to FIGS. 6 and 7.

A power source voltage Vcc is applied to power source terminal 301 at time t1 to bring the potential of power source terminal 301 from "L" to "H". The power source voltage Vcc applied to power source terminal 301 is supplied to each circuit as an operation power source voltage although not shown in FIG. 6. In this case, the power source voltage Vcc applied to power source terminal 301 may be supplied to each circuit after being reduced to a predetermined voltage value by an internal step-down circuit.

At time t2, power-on detection circuit 351 generates a power-on detecting signal POR having a predetermined pulse width in response to the potential rise of power source terminal 301. The power-on detecting signal POR is applied to oscillation control circuit 353 as a dummy cycle designating signal.

Oscillation control circuit 353 brings the oscillation control signal Φ to an active "H" in response to the power-on detecting signal POR at time t3.

Oscillation circuit 352 is activated in response to the oscillation control signal Φ from oscillation control circuit 353 to generate a dummy cycle signal φ serving as a control signal for driving a desired internal circuit such as an RAS related circuit at time t4. The dummy cycle signal φ includes two-phase non-overlapping clock signals φ0 and φ1. The two-phase clock signals φ0 and φ1 are applied to oscillation control circuit 353. Oscillation circuit 352 oscillates while the oscillation control signal Φ is at an active "H" to generate two-phase clock signals φ0 and φ1 alternately.

When the clock signals φ0 and φ1 are applied to oscillation control circuit 353 predetermined times at time t5, oscillation control circuit 353 sets the oscillation control signal Φ to an inactive "L" at time t6. Oscillation circuit 352 stops oscillating in response to the inactive oscillation control signal Φ.

A desired internal circuit such as an RAS related circuit performs a predetermined operation every time a dummy cycle signal φ is generated. The duration of a dummy cycle is determined by an oscillation control signal Φ. Therefore, initialization of a desired internal circuit such as an RAS related circuit is automatically executed predetermined times under the control of a dummy cycle signal φ from dummy cycle generation circuit 350 contained in the semiconductor memory device after application of a power source voltage.

RAS buffer 355 and SC buffer 360 have the outputs disabled in response to the oscillation control signal Φ for the duration of this dummy cycle. External pin terminals 302 and 303 are accordingly inactivated in this dummy cycle period to inhibit an external access. When the oscillation control signal Φ attains an inactive "L" to terminate the dummy cycle, buffers 355 and 360 have the states of the outputs correspond to the signal potentials applied to external pin terminals 302 and 303, respectively. As a result, external pin terminals 302 and 303 are activated to enable external access.

An RAS related circuit serving such as an internal circuit for executing a dummy cycle can operate responsive to a dummy cycle signal, without providing additional circuits, if it is arranged to receive, as an activation control signal, a signal of a logical sum of internal control signals RAS or $\overline{RAS}$ from RAS buffer 355 and a dummy cycle signal φ. This is also the case with a CAS related circuit.

Figure 4:
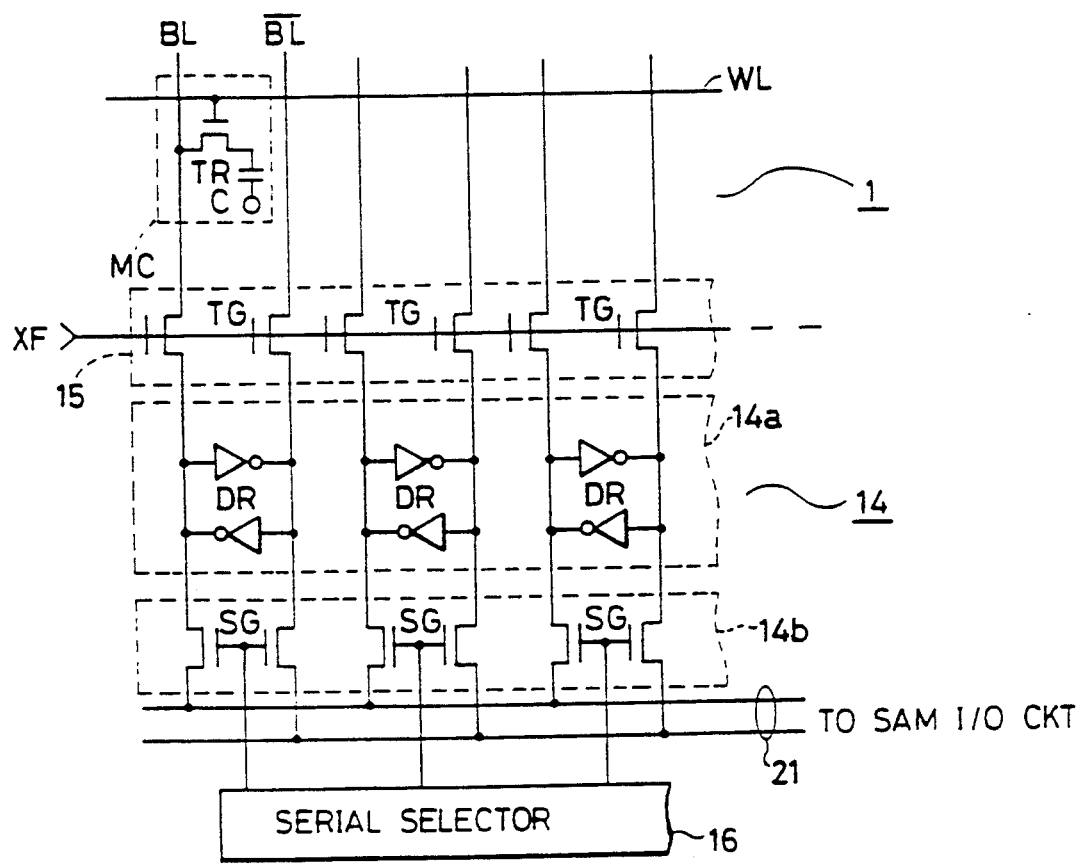
FIG. 4 is a diagram showing the structure of a portion related to data transfer in the VRAM shown in FIG. 3.
Figure 5:
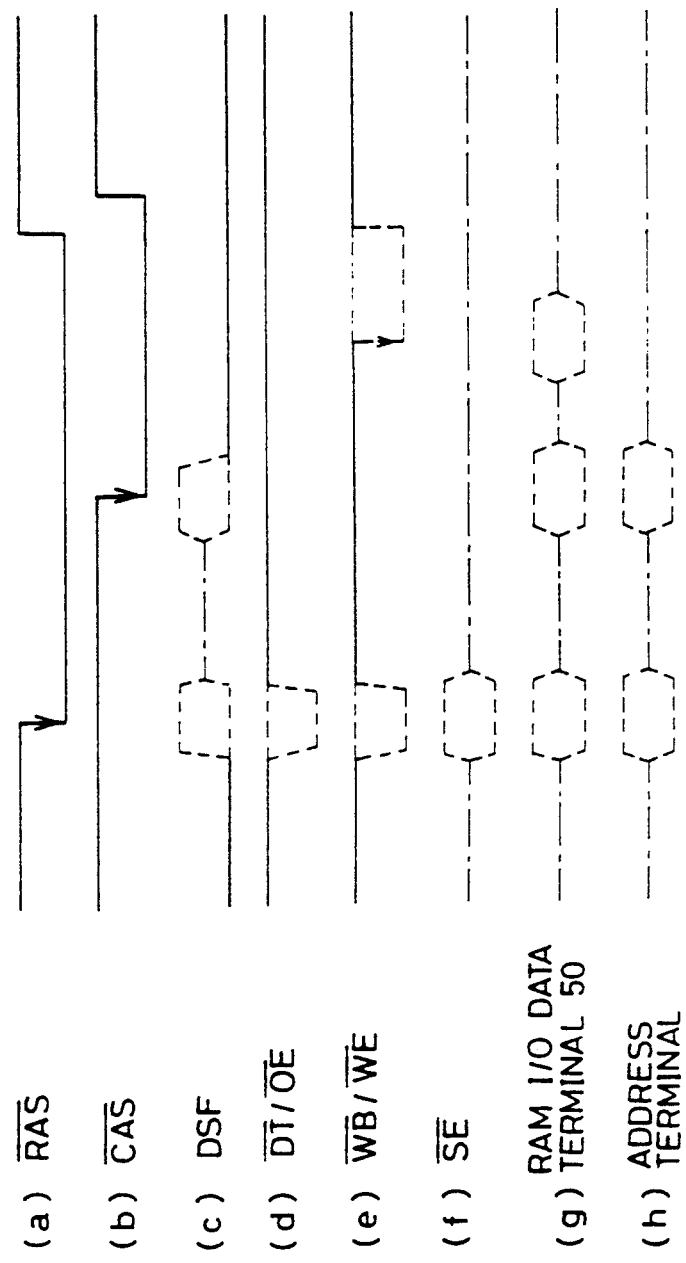
FIG. 5 is a signal waveform diagram showing timing for each control signal for setting an operation mode of the VRAM shown in FIG. 3.

The dummy cycle signal φ, generated independently from external control signal ext.$\overline{RAS}$, can be transmitted to a desired internal circuit. It is therefore possible to initialize all the storage contents of serial register 14 in accordance with a dummy cycle by connecting each data register DR in the serial register 14 shown in FIG. 4 to a transistor switch, for example, for setting the latching potential of the register to a predetermined potential in response to the dummy cycle signal φ. With the data register DR structured by inverter latches, initialization of the serial register can be easily obtained by connecting the input of one inverter to an "H" at power source voltage Vcc level and the input of the other inverter to an "L" at ground potential Vss level in response to the dummy cycle signal φ, for example.

The dummy cycle signal φ, generated independently from control signals $\overline{RAS}$ and RAS, is allowed to initialize a CAS related circuit or a peripheral circuit not included in RAS related circuitry and CAS related circuitry.

Figure 8:
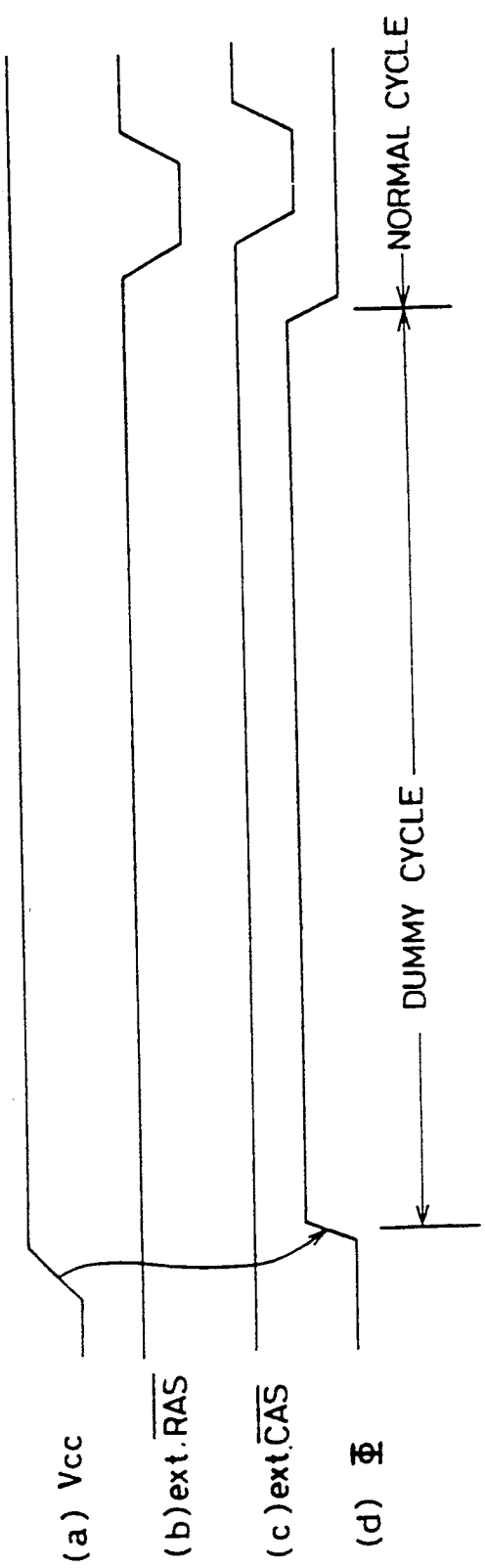
FIG. 8 is a waveform diagram showing the state of external control signals in the execution of the dummy cycle according to the present invention.

FIG. 8 is a signal waveform diagram showing the states of the external control signals of a semiconductor memory device in a dummy cycle according to one embodiment of the present invention. In FIG. 8, an oscillation control signal Φ is generated for a predetermined period when the potential at power source terminal 301 rises to "H" upon an application of an external power source voltage Vcc. Both of the external control signals ext.$\overline{RAS}$ and ext.$\overline{CAS}$ are set to inactive "H" in this dummy cycle. The completion of the dummy cycle period is followed by the change of the external control signal ext.$\overline{RAS}$, which change is detected by RAS buffer 355. Thereafter, a normal cycle starts executing writing or reading of desired data.

As described above, the dummy cycle is internally and automatically executed upon an application of an external power source voltage Vcc to the semiconductor memory device. It is therefore unnecessary to toggle the external control signal ext.$\overline{RAS}$ predetermined times, making designing of the timing for a memory system easy.

External monitoring of the oscillation control signal Φ through the external pin terminal enables an externally provided control circuit such as a CPU to easily detect a dummy cycle period in the semiconductor memory device, thereby starting a normal cycle without providing a timing specification (a delay time required for the external control signal ext.$\overline{RAS}$ to be first brought active after the turning-on of power, and the like).

Figure 9:
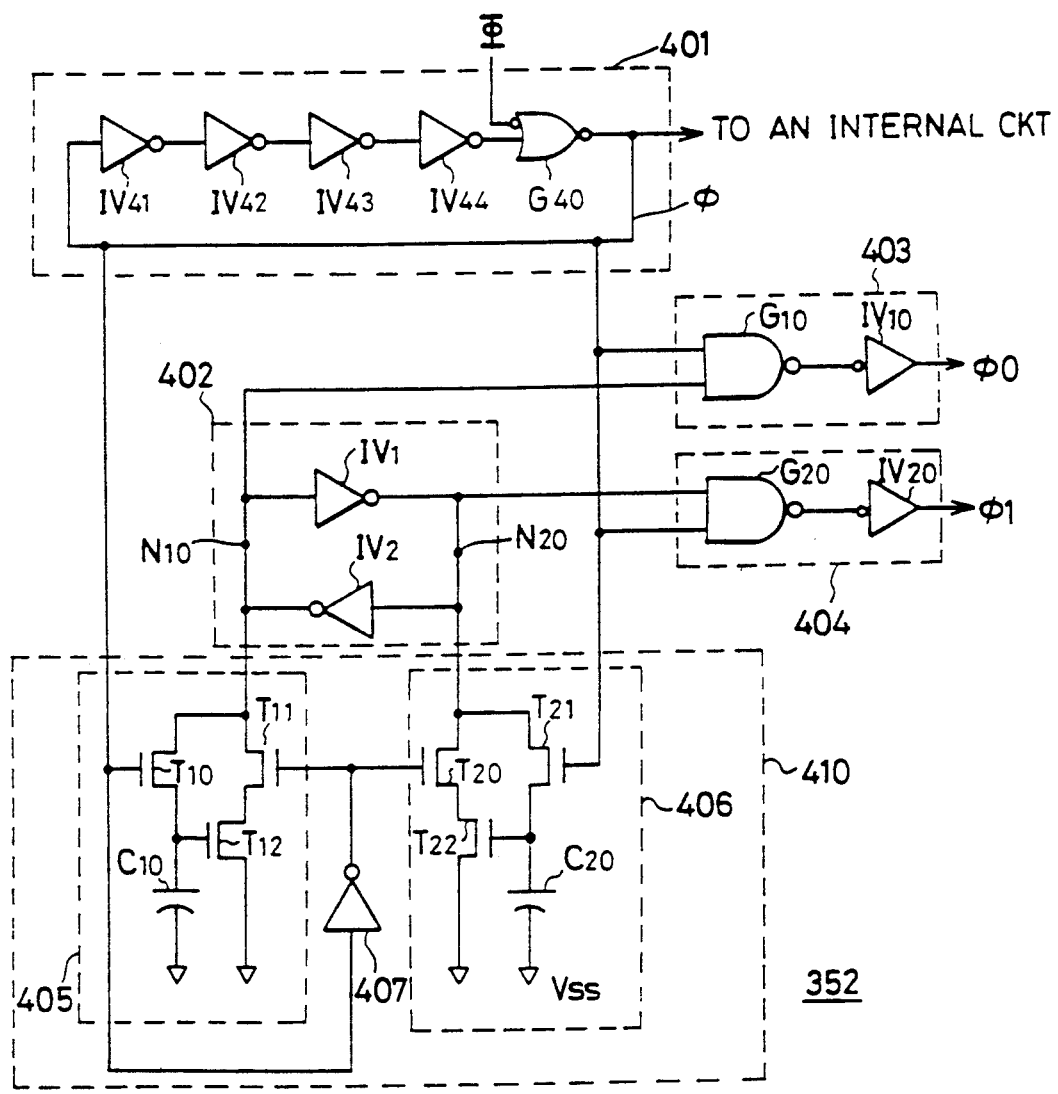
FIG. 9 is a diagram showing one example of a specific structure of the oscillation circuit shown in FIG. 6.

FIG. 9 shows one example of a specific structure of oscillation circuit 352 shown in FIG. 6. In FIG. 9, oscillation circuit 352 includes a ring oscillator 401 oscillating in response to an oscillation control signal φ and generating a dummy cycle signal φ, clock generators 403 and 404 for respectively generating first and second clock signals φ0 and φ1 in response to the dummy cycle signal φ from ring oscillator 401, a latch circuit 402 for setting the clock generation timing of clock generators 403 and 404, and a latch data switching circuit 410 for switching the latch data of latch circuit 402 in response to the dummy cycle signal φ.

Ring oscillator 401 includes four-staged inverter circuits IV41, IV42, IV43 and IV44 connected in a cascade manner and a gate circuit G40 receiving the output signal of inverter circuit IV44 and the oscillation control signal Φ. Gate circuit G40 receives the oscillation control signal Φ at its false input and the output signal of inverter circuit IV44 at its true input. Gate circuit G40 generates a "H" signal only when the oscillation control signal Φ is at "H" and the output signal of inverter circuit IV44 is at "L". Accordingly, gate circuit G40 functions as an inverter circuit when the oscillation control signal φ is at "H". The output signal of gate circuit G40, that is, the dummy cycle signal φ is applied to a desired internal circuit, while it is fed back to the input of the inverter circuit IV41 at the first stage.

Latch circuit 402 includes two inverter circuits IV1 and IV2. Inverter circuit IV1 has an input connected to a node N10 and an output connected to a node N20. Inverter circuit IV2 has an input connected to node N20 and an output connected to node N10. That is, latch circuit 402 is structured as an inverter latch circuit.

Clock generator 403 for generating a clock signal φO includes a 2-input gate circuit G10 for receiving the dummy cycle signal φ and the potential signal at node N10 of latch circuit 402 and an inverter circuit IV10 for receiving the output signal of gate circuit G10. Gate circuit G10 outputs a "L" signal only when both the inputs thereof are at "H". Clock generator 404 for generating a clock signal φ includes a gate circuit G20 for receiving the dummy cycle signal φ and the potential signal at node N20 of latch circuit 402 and an inverter circuit IV20 for receiving the output signal of gate circuit G20. Similar to gate circuit G10, gate circuit G20 outputs a "L" signal only when both the inputs thereof attain "H".

Latch data switching circuit 410 includes a first data setting circuit 405, a second data setting circuit 406 and an inverter circuit 407 for controlling the operation of data setting circuits 405 and 406.

First data setting circuit 405 includes a switching element T10 comprising an n channel MOS transistor (insulated gate type field effect transistor), for example, for connecting one electrode of a capacitor C10 with node N10 in response to the dummy cycle signal φ, a switching transistor T12 comprising an n channel MOS transistor, for example, responsive to the potential of one electrode of capacitor C10 to turn on, and a switching element T11 comprising an n channel MOS transistor, for example, responsive to the output signal of inverter circuit 407 to turn on to connect one conduction terminal of switching element T12 with node N10. The other electrode of capacitor C10 is connected to a predetermined potential Vss which is a ground potential, for example. The other conduction terminal of switching element T12 is similarly connected to potential Vss.

Second data setting circuit 406 similarly includes a capacitor C20, a switching element T21 comprising an n channel MOS transistor, for example, responsive to the dummy cycle signal φ for connecting one electrode of capacitor C20 with node N20, a switching element T22 comprising an n channel MOS transistor, for example, responsive o the potential of one electrode of capacitor C20 to turn on, and a switching element T20 comprising an n channel MOS transistor, for example, responsive to the output signal of inverter circuit 407 for connecting node N20 with one conduction terminal of switching element T22. The other electrode of capacitor C20 and the other conduction terminal of switching element T22 are both connected to the potential Vss. Inverter circuit 407 inverts the dummy cycle signal φ. Operation will be described in the following.

Immediately after turning on power source, the potentials at nodes N10 and N20 are fixed to signal potentials complementary to each other depending on the state of the respective nodes at that time in latch circuit 402. It is assumed that node N10 is initialized to "H" and node N20 is initialized to "L". The oscillation control signal Φ remains "L" immediately after the turning-on of the power. The output signal of gate circuit G40, that is, the dummy cycle signal φ is at "L". Consequently, the outputs of gate circuits G10 and G20 attain "H", while clock signals φ0 and φ1 are both at "L".

Upon generation of a power-on detection signal POR as a dummy cycle designating signal from power-on detection circuit 351 shown in FIG. 6, an oscillation control circuit 353 (see FIG. 6) which will be described in detail later, generates an oscillation control signal Φ (see the operation waveform of FIG. 7). When the oscillation control signal Φrises to "H", gate circuit G40 operates as an inverter circuit. The dummy cycle signal φ is at "L" before the rise of the oscillation control signal Φ to "H". The output signal of inverter circuit IV44 is fixed at "L" after the turning-on of power. As a result, the dummy cycle signal φ which is the output signal of gate circuit G40 rises to "H" in response to the rise of the oscillation control signal Φ to "H".

At the rise of the dummy cycle signal φ to "H", the output signal of gate circuit G10 receiving the signal potential at node N20 of latch circuit 402 at its input attains "L" and clock signal φ0 from inverter circuit IV10 rises to "H". At this time, with the signal potential of node N20 being at "L", the clock signal φ1 remains "L".

Switching elements T10 and T21 in latch data switching circuit 410 are turned on in response to the rise of the dummy cycle signal φ to "H". One electrode of capacitor C10 in latch data setting circuit 405 is charged to "H", while one electrode of capacitor C20 is charged to "L". As a result, switching element T12 is turned on and switching element T22 is turned off.

After the rise of the dummy cycle signal $\phi$ to "H", the dummy cycle signal $\phi$ falls to "L" after a lapse of a delay time of inverters IV41–IV44 and gate circuit G40. As a result, the clock signal $\phi 0$ falls to "L". The output signal of inverter circuit 407 rises to "H" in response to the fall of the dummy cycle signal $\phi$ to "L" to turn on switching elements T11 and T20.

Switching element T12 is set to be on and switching element T22 is set to be off by the charge potentials of capacitors C10 and C20, respectively. The current drivability of data setting circuits 405 and 406 is set to be larger than the latching capability of latch circuit 402. Consequently, the signal potential of the data "H" at node N10 is lowered to "L" at a high speed. As a result, the potential at node N10 becomes "L" and the signal potential of node N20 becomes "H".

With the potential of node N10 being at "L" and the signal potential of node N20 being at "H", the clock signal $\phi 0$ attains "L" and the clock signal $\phi 1$ attains "H" upon a subsequent rise of the dummy cycle signal $\phi$ to "H".

That is, clock signals $\phi 0$ and $\phi 1$ are alternately generated every generation (activation) of the dummy cycle signal $\phi$. This operation will be repeated while the oscillation control signal $\Phi$ is at "H". More specifically, every time a dummy cycle signal is generated, the latch data of latch circuit 402 is switched in turn under the control of latch data switching circuit 410 to generate clock signals $\phi 0$ and $\phi 1$ alternately After predetermined times of generation of the clock signals $\phi 0$ and $\phi 1$, oscillation control circuit 353 brings the oscillation control signal $\Phi$ down to "L". In response thereto, the output signal of gate circuit G40, that is, the dummy cycle signal $\phi$ attains "L" and both of the clock signals $\phi 0$ and $\phi 1$ attain "L".

The above-described operation automatically generates a dummy cycle signal predetermined times for initializing an internal circuit.

The circuit structure shown in FIG. 9 is one example and any circuit structure can be used as generating a dummy cycle signal $\phi$ while the oscillation control signal $\Phi$ is being generated and clock signals $\phi 0$ and $\phi 1$ are alternately generated in response to the dummy cycle signal $\phi$.

Figure 10:
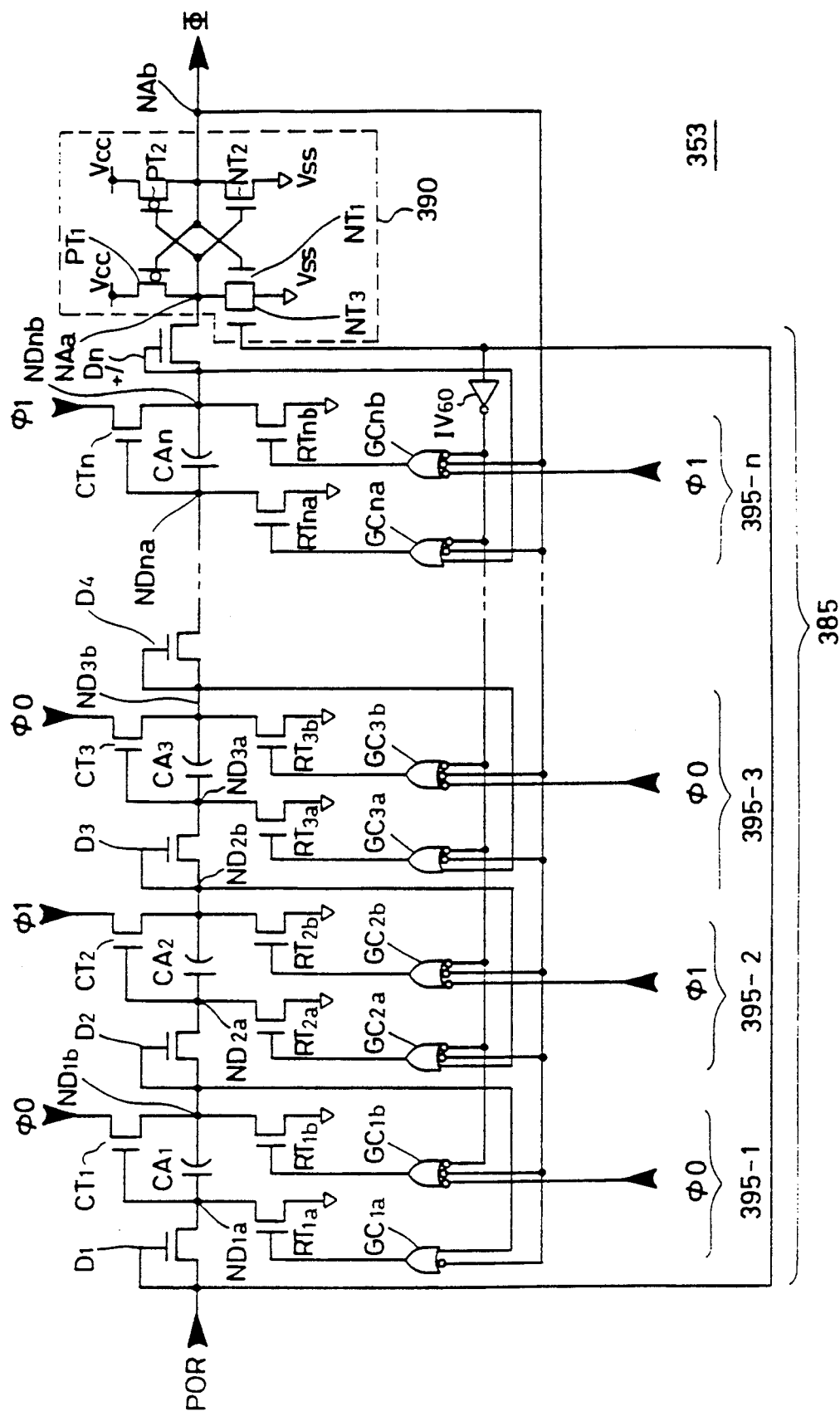
FIG. 10 is a diagram showing one example of a specific structure of the oscillation control circuit shown in FIG. 6.

FIG. 10 is a diagram showing one example of a specific structure of oscillation control circuit 353 shown in FIG. 6. Oscillation control circuit 353 shown in FIG. 10 can be used as a combination with oscillation circuit 352 shown in FIG. 9.

In FIG. 10, oscillation control circuit 353 includes a circuit block 385 for determining a duration of the active state of oscillation control signal $\Phi$ and an output circuit 390 for outputting the oscillation control signal $\Phi$ in response to an output signal of circuit block 385 and the power-on detection signal POR. Circuit block 385 is activated in response to the power-on detection signal POR to render the oscillation control signal $\Phi$ from output circuit 390 inactive while receiving clock signals $\phi 0$ and $\phi 1$ (that is, the dummy cycle signal $\phi$) predetermined times.

Circuit block 385 includes signal transmission stages 395-$l$ to 395-$n$ connected in cascade in n stages. Signal transmission stage 395-$i$ (i=1−n) includes a diode-connected n channel MOS transistor Di for receiving an output signal from a signal transmission stage in a preceding stage, an n channel MOS transistor CTi responsive to the output of transistor Di to turn on to transmit a clock signal $\phi$ ($\phi 0$ or $\phi 1$) to an output node NDib, a bootstrap capacitance CAi connected between a gate and one conduction terminal of transistor CTi and switching transistors RTia and RTib comprising an n channel MOS transistor, for example, for resetting nodes NDia and NDib, respectively.

Signal transmission stage 395-$i$ further includes gate circuits GCia and GCib for controlling on and off of switching transistors RTia and RTib. A gate circuit GCja (j=2−n) receives output node NDjb at its true input, an oscillation control signal $\Phi$ at its false input and a power-on detection signal POR at its false input through an inverter circuit IV60. Gate circuit GCja outputs a signal of "H" when the potential at the related output node NDjb attains "H", or the oscillation control signal $\Phi$ attains "L" or the power-on detection signal POR attains "H".

A gate circuit GC1a included in signal transmission stage 395-$l$ at the first stage receives the output of its output node ND1b at its true input and the oscillation control signal $\Phi$ at its false input. Gate circuit GC1a outputs a signal of "H" when the potential at output node ND1b attains "H" or the oscillation control signal $\Phi$ attains "L".

Gate circuit GCib (i=1−n) receives a clock signal $\Phi$ ($\phi 0$ or $\phi 1$) at its false input, an oscillation control signal $\Phi$ at its false input and a power-on detection signal POR at its false input through inverter circuit IV60. Gate circuit GCib outputs a signal of "H" when at least one of the three inputs thereof attains "L".

Output circuit 390 includes a CMOS inverter comprising a complementarily connected p channel MOS transistor PT1 and an n channel MOS transistor NT1 and a CMOS inverter comprising a complementary connection of a p channel MOS transistor PT2 and an n channel MOS transistor NT2. The gates of transistors PT1 and NT1 are connected to an output node NAb. The gates of transistors PT2 and NT2 are connected to an input node NAa. An n channel MOS transistor NT3 having a gate receiving a power-on detection signal POR is further provided in parallel to transistor NT1. Operation will be described in the following.

When a power source voltage is applied to the semiconductor memory device, a power-on detection signal POR from a power-on detection circuit rises to "H". In response thereto, transistor NT3 turns on to set node NAa to "L" of the potential Vss. The potential at output node NAb attains "H" to generate (activate) an oscillation control signal $\Phi$ (activated). The power-on detection signal POR is also applied to the false input of gate circuit GCib through inverter circuit IV60. All the switching transistors RTib are turned on in response to the power-on detection signal POR to reset the node NDib to "L". Similarly, the power-on detection signal POR is applied to the false input of gate circuit GCja through inverter circuit IV60. As a result, switching transistor RTja is turned on to reset the node NDja to "L". The output signal of gate circuit GC1a attains "L" when the oscillation control signal $\Phi$ is activated, turning on switching transistor RT1a.

Diode-connected transistor D1 turns on when the level of power-on detection signal POR exceeds a threshold voltage thereof, to start charging the node ND1a. Transistor CT1 is turned on in response to the charging of node ND1a.

When power-on detection signal POR falls to "L", switching transistor RT1b is turned off. With a clock signal $\phi 0$ applied in this state, node ND1b is charged through transistor CT1. The charge potential of node ND1b is fed back to node ND1a through bootstrap capacitance CA1 to further increase the gate potential of transistor CT1. As a result, transistor CT1 is completely turned on at a high speed to transmit the clock signal $\phi 0$ to node ND1b without causing a signal loss. The signal potential at the node ND1b is transmitted to node ND2a through diode-connected transistor D2. With no clock signal $\phi 1$ being generated at this time, only one electrode of bootstrap capacitance CA2 is charged.

When the clock signal $\phi 0$ falls to "L", the output signal of gate circuit GC1b attains "H", switching transist or RT1b is turned on and the potential at node ND1b becomes "L". As a result, diode-connected transistor D2 is turned off. Node ND2a having been already charged to "H" is maintained at the charged potential. When node ND1b is charged to "H", gate circuit GC1a outputs a signal of "H" to turn on switching transistor RT1a. As a result, the potential at node ND1a becomes "L".

Upon the subsequent application of the clock signal $\phi 1$, the output signal of gate circuit GC2b attains "L" to turn off the switching transistor RT2b. Switching transistor CT2 having been already on transmits the clock signal $\phi 1$ to node ND2b. The charge potential of node ND2b is fed back to the gate of transistor CT2 through bootstrap capacitance CA2 to charge the potential at node ND2b at a high speed. The potential at node ND2b is transmitted to node ND3a through transistor D3. When the potential at node ND2b rises to "H", switching transistor RT2a is turned on, so that the potential at node ND2a goes to "L".

When the clock signal $\phi 1$ falls to "L", the output signal of gate circuit GC2b turns on the transistor RT2b to set the potential at node ND2b to "L". As a result, node ND3a is maintained at "H".

Upon the subsequent application of a clock signal $\phi 0$, the potential at node ND3b rises to "H". The potential of node NDna rises to "H" through the repetition of this operation hereinafter. Several times (n/2 in FIG. 10) of generation of the clock signal $\phi 1$ charges node NDnb to a "H" potential. The charge potential of the node NDnb is transmitted to node NAa through transistor Dn+1. When node NAa is charged to "H", the potential at node NAb goes to "L", so that the latch state of latch circuit 390 is reverted and the oscillation control signal $\Phi$ attains "L". When the oscillation control signal $\Phi$ attains "L", all the outputs of gate circuits GCia and GCib become "H" irrespective of the state of the clock signal $\phi$ ($\phi 0$, $\phi 1$), thereby reliably setting all the nodes ND1a–NDna and ND1b–NDnb of the respective signal transmission stages 395-l through 395-n to "L".

It is possible to reliably set the oscillation control signal $\Phi$ to "L" after predetermined times of generation of a clock signal $\phi$ as a result of the sequential transmission of a charge potential ("H") every time clock signal $\phi$ ($\phi 0$ and $\phi 1$) is generated after the generation of power-on detection signal POR. The number of generation of the clock signal $\phi$ ($\phi 0$ and $\phi 1$) is determined by the number of stages of the signal transmission stages 395-l through 395-n.

In the oscillation circuit shown in FIG. 9, the order of the generation of the clock signals $\phi 0$ and $\phi 1$ is variable. The latch initial state of latch circuit 402 (see FIG. 9) is determined by the difference between current drivabilities of the inverters (subtlely varying according to manufacturing parameters and differing with each element) and the like. In such a case, therefore, the duration of the oscillation control signal $\Phi$ might deviate for each device by one cycle of the clock signal $\phi$. That is, a first generation of a clock signal $\phi 1$ might be ignored. In such a case, provision of a switching transistor for initializing nodes N10 and N20 to "H" and "L", respectively in response to power-on detection signal POR in latch circuit 402 shown in FIG. 9 reliably sets the initial latch data of latch circuit 402, thereby fixing the generation order of the clock signals $\phi 0$ and $\phi 1$.

Figure 11:
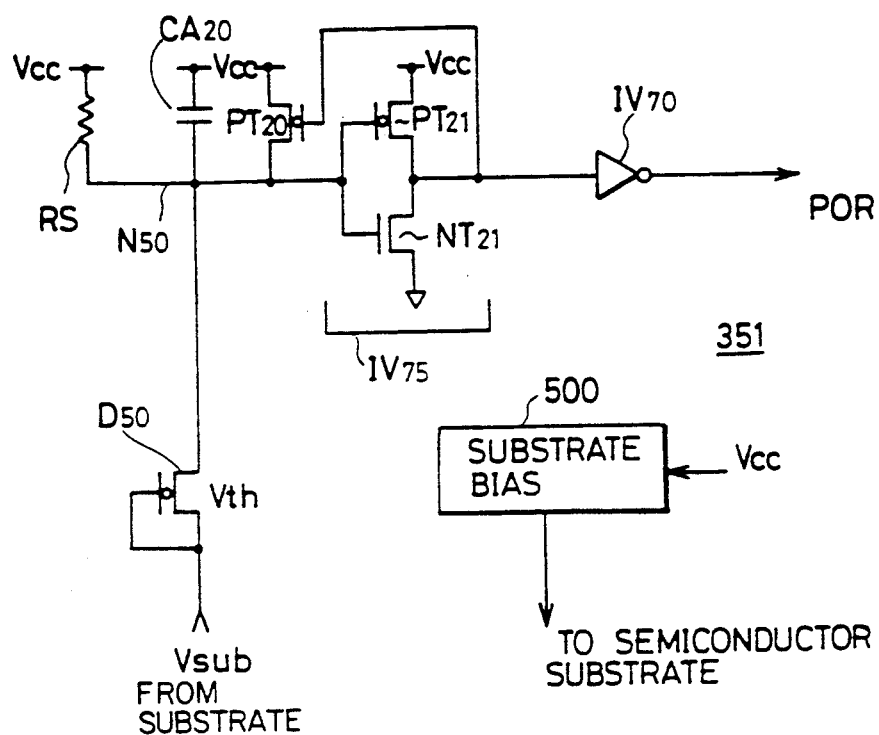
FIG. 11 is a diagram showing one example of a specific structure of the power-on detection circuit.

FIG. 11 is a diagram showing one example of a specific structure of power-on detection circuit 351 shown in FIG. 6. A predetermined bias potential Vsub is applied to a semiconductor substrate on which the semiconductor memory device is formed. The application of substrate bias potential Vsub is aimed at preventing capacitive coupling between the semiconductor substrate and a signal line, preventing fluctuation of the substrate potential caused by the flow-in of a substrate current and optimizing a threshold voltage of an MOS transistor. Such a substrate bias potential Vsub is usually generated and applied by an on-chip substrate bias generation circuit. In FIG. 11 showing power-on detection circuit 351, the semiconductor memory device is formed on a P type semiconductor substrate with a negative substrate bias potential Vsub.

In FIG. 11, power-on detection circuit 351 includes a register RS and a capacitor CA20 for charging a node N50 in response to the power source voltage Vcc, a CMOS inverter circuit IV75 comprising an p channel MOS transistor PT21 and an n channel MOS transistor NT21 for inverting the signal potential of node N50, an inverter circuit IV70 for receiving the output of CMOS inverter circuit IV75 and a p channel MOS transistor PT20 for receiving the output of inverter circuit IV75 at its gate and connecting the node N50 and the power source Vcc. Resistor RS and capacitor CA20 are provided in parallel to each other. Transistor PT20 is provided for speeding up and stabilizing the circuit operation of inverter circuit IV75.

Figure 12:
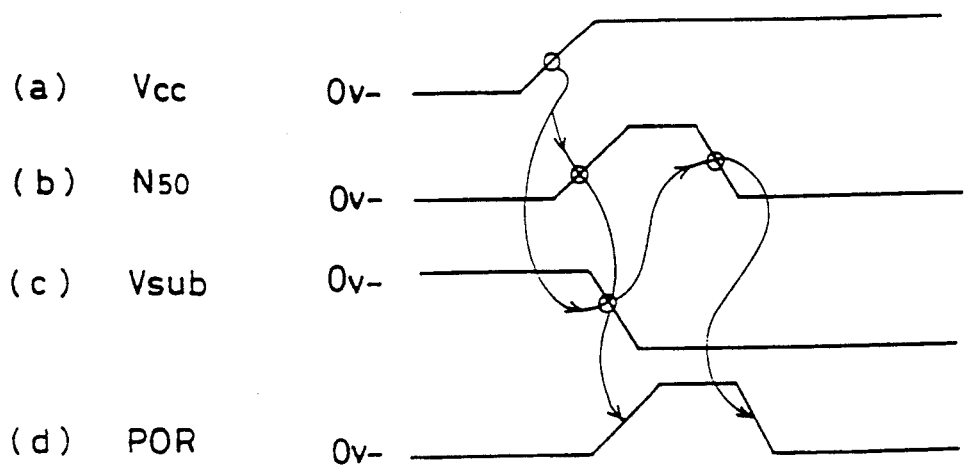
FIG. 12 is a signal waveform diagram showing the operation of the power-on detection circuit shown in FIG. 11.

Power-on detection circuit 351 further includes a diode-connected p channel MOS transistor D50 provided between node N50 and the semiconductor substrate. Diode-connected transistor D50 detects the bias potential Vsub applied from substrate bias generation circuit 500 to the semiconductor substrate. Transistor D50 at an on-state, with its threshold voltage being Vth, sets node N50 to Vsub+Vth. The operation will be described with reference to the operation waveform diagram of FIG. 12.

Substrate bias generation circuit 500 is activated in response to the application of power source voltage Vcc to set the semiconductor substrate to a predetermined negative potential after a lapse of several hundreds $\mu$s. With substrate potential Vsub not exceeding the threshold voltage of transistor D50 immediately after the turning-on of power, transistor D50 is off. Upon the application of power source voltage Vcc, node N50 is charged through resistor RS and is also charged by the charge pumping operation of capacitor CA20. When the potential at node N50 rises to "H", power-on detection signal POR rises to "H" through inverter circuits IV75 and IV70. The output of inverter circuit IV75 is being applied to the gate of transistor PT20. Transistor PT20, when the output of inverter circuit IV75 attains "L", connects power source Vcc to node N50, thereby stabilizing the potential of node N50 at a high speed.

When bias potential Vsub of the semiconductor substrate exceeds the threshold voltage of transistor D50 as a result of the operation of semiconductor bias generation circuit 500, transistor D50 is turned on to ultimately becomes to "L" of Vsub+vth. As a result, power-on detection signal POR falls to "L" through inverter circuits IV75 and IV70.

The potential at node N50 is discharged to the semiconductor substrate through transistor D50. Node N50 is connected to power source voltage Vcc through resistor RS. Therefore, current is constantly supplied from power source voltage Vcc to the semiconductor substrate, which might adversely affect the bias potential of the semiconductor substrate. This, however, can be prevented by setting the on-resistance of transistor D50 to be sufficiently large to make the current flowing therethrough very small or by setting the resistance value of the resistor RS to be relatively large.

Figure 13:
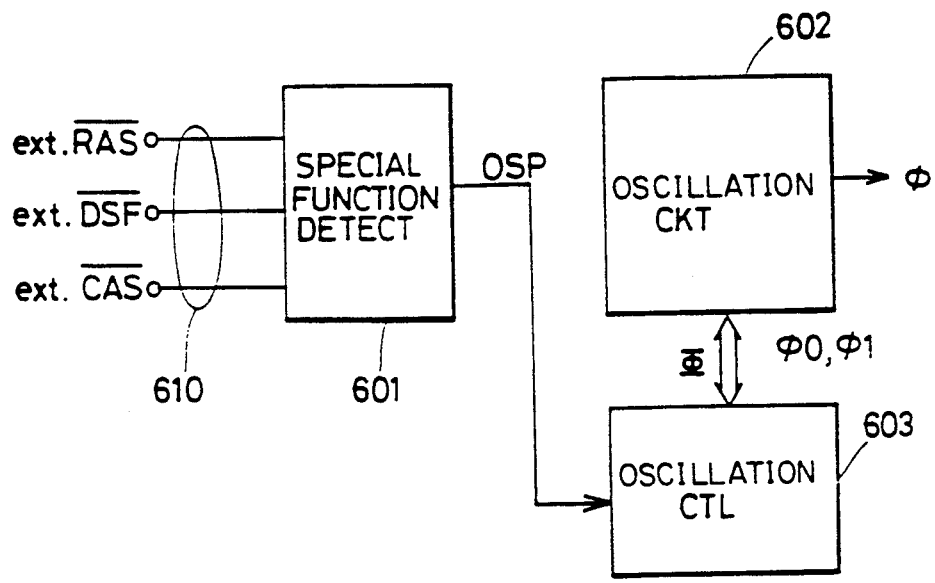
FIG. 13 is a functional block diagram showing the structure of a dummy cycle generation circuit according to another embodiment of the present invention.

In the structure shown in FIG. 6, a dummy cycle is internally generated only immediately after turning-on of power. In a VRAM and the like, however, a dummy cycle should be executed in each of various operation modes. FIG. 13 shows the structure for internally generating a dummy cycle signal according to these operation modes.

In FIG. 13, a dummy cycle generation circuit includes a special function detection circuit 601 for receiving a predetermined combination of external clock signals ext.$\overline{RAS}$, ext.DSF and ext.$\overline{CAS}$ applied to a clock input terminal 610 to determine as to whether a special function mode for executing in a dummy cycle has been set or not, an oscillation control circuit 603 responsive to an detection signal OSP from special function detection circuit 601 for generating an oscillation control signal Φ and applying the same to an oscillation circuit 602, and an oscillation circuit 602 responsive to the oscillation control signal Φ and applying the same to an oscillation circuit 602, and an oscillation circuit 602 responsive to the oscillation control signal Φ from oscillation control circuit 603 to oscillate to generate a dummy cycle signal Φ. The structures of oscillation circuit 602 and oscillation control circuit 603 are the same as those of the counterparts shown in FIGS. 9 and 10.

External control signals ext.$\overline{RAS}$, ext.DSF and ext.$\overline{CAS}$ are the same as the control signals shown in FIG. 3. In this case, a special function is set to execute a dummy cycle when external control signal ext.DSF attains "H" at the falling edge of external control signal ext.$\overline{RAS}$ and/or ext.$\overline{CAS}$. Special function detection circuit 601, in response to thus set special function, generates a special function detection signal OSP similar to power-on detection signal POR as a dummy cycle designation signal and applies the same to oscillation control circuit 603. Oscillation circuit 602 and oscillation control circuit 603 operate in the same manner as in the above-described embodiment to transmit the dummy cycle signal φ to an internal circuit to be initialized relating to the set special function for a predetermined time period.

As an external control signal to be applied to special function detection circuit 601, various control signals $\overline{WB}/\overline{WE}$, $\overline{DT}/\overline{OE}$ and the like can be used other than the external control signals shown in FIG. 13. It is also possible to provide a plurality of special function detection circuits 601 corresponding to respective detected function modes. The internal circuits are grouped corresponding to respective special function detection circuits, or to respective function modes. In this case, only the unomittable minimum of internal circuits are initialized according to a designated special mode.

When various operation modes are set in response to predetermined external clock signals, a DRAM also accordingly enables initialization of a required internal circuit.

Figure 14:
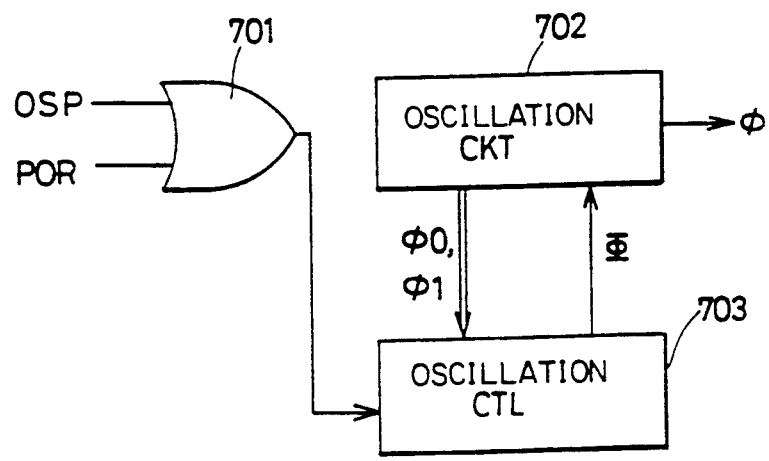
FIG. 14 is a functional block diagram showing the structure of a dummy cycle generation circuit according to a further embodiment of the present invention.

FIG. 14 is a diagram showing the structure of a dummy cycle generation circuit according to a further embodiment of the present invention. The dummy cycle generation circuit shown in FIG. 14 includes an OR circuit 701 receiving a special function detection signal OSP and a power-on detection signal POR. The output of OR circuit 701 is applied to an oscillation control circuit 703 as a dummy cycle designation signal. OR circuit 701 generates a dummy cycle designation signal to drive oscillation control circuit 703 when either special function detection signal OSP or power-on detection signal POR is generated. An oscillation circuit 702 oscillates to generate a dummy cycle signal φ in response to an oscillation control signal φ from oscillation control circuit 703. The structure shown in FIG. 14 allows a dummy cycle to be internally generated both in the detection of power-on and the detection of a special function.

As described in the foregoing, the present invention structured to internally and automatically generate and stop a control signal for executing a dummy cycle when necessary, eliminates the necessity of a control signal for externally setting the start and the end of the dummy cycle as well as controlling the dummy cycle, thereby facilitating designing of the timing of a memory system. In addition, with the dummy cycle signal internally and automatically generated, it is possible to apply the dummy cycle signal to a required internal circuit to reliably and readily initialize a desired internal circuit according to an operation mode and the like without increasing the number of pin terminals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operable in a dummy cycle for initializing an internal circuit, comprising:
   first generating means responsive to a predetermined input signal for generating a dummy mode designating signal; and
   second generating means response to said dummy mode designating signal for generating a dummy cycle control signal for toggling the internal circuit a predetermined number of times.

2. A semiconductor memory device according to claim 1, wherein said first generating means comprises means responsive to application of a power source voltage to said semiconductor memory device for generating a power-on detecting signal as said dummy mode designating signal.

3. A semiconductor memory device according to claim 2, wherein said means responsive to application includes;
   charging means responsive to the application of the power source voltage for charging a first node;
   means responsive to a potential at said first node for generating said power-on detecting signal; and discharge means responsive to a potential of a substrate on which said semiconductor memory device is formed, for discharging said first node.

4. A semiconductor memory device according to claim 3, wherein said charge means includes a resistance means and a capacitance means connected in parallel between said first node and a power source line.

5. A semiconductor memory device according to claim 1, wherein said first generating means includes means responsive to a special mode designating signal designating a special operating mode of said semiconductor memory device, for generating a special mode detecting signal as said dummy cycle designating signal.

6. A semiconductor memory device operable in a dummy cycle for initializing an internal circuit, comprising:
   first generating means responsive to a predetermined input signal for generating a dummy mode designating signal; and
   second generating means responsive to said dummy mode designating signal for generating a dummy cycle control signal for driving the internal circuit a predetermined number of times, wherein said second generating means includes
   i) an oscillation control means responsive to said dummy mode designating signal for generating an oscillation control signal; and
   ii) an oscillating means responsive to said oscillation control signal, for generating said dummy cycle control signal, said oscillation control means including means for counting said dummy cycle control signal to deactivate said oscillation control signal when a predetermined number of the dummy cycle control signals is counted.

7. A semiconductor memory device according to claim 6, wherein said oscillating means includes;
   ring oscillator means activated in response to said oscillation control signal for generating said dummy cycle control signal; and
   clock generator means responsive to said dummy cycle control signal for generating two-phase non-overlapping clock signals to said oscillation control means.

8. A semiconductor memory device according to claim 7, wherein said clock generator means includes:
   latching means including a first latching node and a second latching node for latching complementary signals at said first and second latching node;
   a first gate means responsive to said dummy cycle control signal and a signal latched at said first latching node, for generating a first clock,
   a second gate means responsive to said dummy cycle control signal and a signal latched at said second latching node, for generating a second clock; and
   alternating means responsive to said dummy cycle control signal for changing respective signal levels at said first and second latching nodes alternately.

9. A semiconductor memory device according to claim 8, wherein said alternating means includes;
   first latching means responsive to said dummy cycle control signal for latching a signal level at said first latching node,
   first setting means responsive to a signal latched by said first latching means and to said dummy cycle control signal for setting a signal level at said first latching node, said first latching means and said first setting means being activated complementarily with each other;

second latching means responsive to said dummy cycle control signal for latching a signal level at said second latching node; and
   second setting means responsive to said dummy cycle control signal and a signal level latched by said second latching means for setting a signal level at said second latching node, said second latching means and said second setting means being activated complementarily with each other.

10. A semiconductor memory device according to claim 7, wherein said means for counting includes a plurality of cascade-connected signal transfer stages for sequentially transferring said dummy cycle designating signal in response to said two-phase non-overlapping clock signals.

11. A semiconductor memory device according to claim 10, wherein said oscillation control means further includes flip-flop means being set in response to said dummy cycle designating signal to generate said oscillation control signal and being reset in response to an output of said cascade-connected signal transfer stages to deactive said oscillation control signal.

12. A semiconductor memory device according to claim 10, wherein said cascade-connected signal transfer stages includes alternate arrangement of a first transfer stage responsive to one clock signal of said two-phase non-overlapping clock signals and a second transfer stage responsive to another clock signal of said two-phase non-overlapping signals.

13. A semiconductor memory device according to claim 12, wherein said first transfer stage includes diode means receiving an output of a preceding second transfer stage and passing thus received output to a first node thereof;
   a transfer gate responsive to a signal level at the first node for transferring the one clock signal to a second node thereof; and
   feed back means for feeding back a signal potential at the second node to a control gate of said transfer gate.

14. A semiconductor memory device according to claim 13, wherein the first transfer stage further includes a first resetting means responsive to a signal level of the second node of said the first transfer stage and said oscillation control signal and said dummy cycle designating signal for resetting a signal level of said first node of said the first transfer stage, and
   a second resetting means responsive to said dummy cycle designating signal, said one clock signal and said oscillation control signal for resetting said second node of said the first transfer stage.

15. A semiconductor memory device according to claim 12, wherein said second transfer stage includes;
   diode means receiving an output of a preceding first transfer stage and passing thus received output to a first node thereof,
   transfer gate responsive to a signal level at said first node for transferring said another clock signal to a second node thereof; and
   feedback means for feeding back a signal at said second node to said first node.

16. A semiconductor memory device according to claim 15, wherein said second transfer stage further includes,
   a first resetting means responsive to said dummy cycle designating signal, said oscillation control signal and a signal level at said second node of said the second transfer stage for resetting the first node of said the second transfer stage; and a second resetting means responsive to said another clock signal, said oscillation control signal and said dummy cycle designating signal, for resetting a signal potential at the second node of said the second transfer stage.

17. A method of initializing an internal circuit of a semiconductor memory device, comprising the steps of:

generating internally a dummy cycle designating signal in response to a received input signal;

consecutively toggling a dummy cycle activation signal a predetermined number of times, in response to said dummy cycle designating signal; and applying said dummy cycle activation signal to said internal circuit for initialization thereof.

18. A method according to claim 17, wherein said step of generating a dummy cycle designating signal includes the steps of detecting power-on of said semiconductor memory device, and generating said dummy cycle designating signal in response to detection of the power-on.

19. A method according to claim 18, wherein said step of generating a dummy cycle designating signal includes the step of detecting a designation of a special operation mode of said semiconductor memory device, in response to a combination of a predetermined control signals and generating said dummy cycle activation signal in response to detection of the special operation mode.

20. A method of initializing an internal circuit of a semiconductor memory device, comprising the steps of:

a) generating internally a dummy cycle designating signal in response to a received input signal;

b) generating, consecutively, a dummy cycle activation signal a predetermined number of times, in response to said dummy cycle designating signal, said step of generating a dummy cycle activation signal comprising the steps of i) generating a dummy cycle control signal ($\Phi$) in response to said dummy cycle designating signal;

ii) generating clock signals ($\phi$) as said dummy cycle activation signal at a predetermined interval while said dummy cycle control signal is active;

iii) counting said clock signals; and iv) deactivating said dummy cycle activation signal when a count of said clock signals indicates a predetermined number; and c) applying said dummy cycle activation signal to said internal circuit for initialization thereof.

* * * * *